(12) United States Patent
Duensing (10) Patent No.: US 7,233,147 B2
(45) Date of Patent: Jun. 19, 2007

(54) METHOD AND APPARATUS FOR MAGNETIC RESONANCE IMAGING INCORPORATING A SPIRAL COIL

(75) Inventor: G. Randy Duensing, Gainesville, FL (US)

(73) Assignee: Invivo Corporation, Gainesville, FL (US)

( * ) Notice: Subject to any disclaimer, the term of this patent is extended or adjusted under 35 U.S.C. 154(b) by 0 days.

(21) Appl. No.: 10/200,893

(22) Filed: Jul. 22, 2002

(65) Prior Publication Data

US 2003/0020476 A1    Jan. 30, 2003

Related U.S. Application Data

(60) Provisional application No. 60/306,962, filed on Jul. 20, 2001.

(51) Int. Cl.
*G01V 3/00* (2006.01)
(52) U.S. Cl. .................................... 324/318
(58) Field of Classification Search ............... 324/318, 324/307, 289, 322, 309; 600/410
See application file for complete search history.

(56) References Cited

U.S. PATENT DOCUMENTS

| | | | | |
|---|---|---|---|---|
| 4,129,822 | A | * | 12/1978 | Traficante .................... 324/322 |
| 4,680,548 | A | | 7/1987 | Edelstein et al. |
| 4,879,516 | A | * | 11/1989 | Mehdizadeh et al. ........ 324/318 |
| 4,987,370 | A | * | 1/1991 | Leussler et al. ............. 324/318 |
| 4,998,066 | A | * | 3/1991 | Wichern et al. ............. 324/322 |
| 5,068,611 | A | | 11/1991 | Savelainen |
| 5,477,146 | A | * | 12/1995 | Jones ........................ 324/318 |
| 5,592,088 | A | | 1/1997 | Matsunaga et al. |
| 5,621,322 | A | | 4/1997 | Ehnholm |
| 5,666,055 | A | * | 9/1997 | Jones et al. ................. 324/318 |
| 5,689,188 | A | * | 11/1997 | Claasen-Vujcic ........... 324/318 |
| 5,867,027 | A | * | 2/1999 | Kawamoto .................. 324/322 |
| 5,929,639 | A | * | 7/1999 | Doty .......................... 324/318 |
| 6,020,725 | A | * | 2/2000 | Roberts ....................... 322/90 |
| 6,023,166 | A | * | 2/2000 | Eydelman .................. 324/318 |
| 6,100,694 | A | | 8/2000 | Wong |
| 6,201,392 | B1 | | 3/2001 | Anderson et al. |

(Continued)

FOREIGN PATENT DOCUMENTS

EP        0768539 A2      4/1997

(Continued)

OTHER PUBLICATIONS

Z. Zhang et al.; "Application of a novel RF coil design to the magnetic resonance force microscope" 1996;American Institude o Physics; Sci. Instrum. 67 (9), pp. 3307-3309.*

(Continued)

*Primary Examiner*—Brij Shrivastav
*Assistant Examiner*—Dixomara Vargas
(74) *Attorney, Agent, or Firm*—Saliwanchik, Lloyd & Saliwanchik (57) ABSTRACT

The subject invention pertains to a method and apparatus utilizing one or more spiral coils, such as spiral birdcage coils, spiral saddle coils, Helmholtz coil pairs, and other spiral volume and spiral surface coils. The spiral coils of the subject array can be substantially isolated from each other while covering nearly the same volume or surface. For cylindrical geometrics, isolation can be enhanced by having the rotation, or change in direction from one end of the coil to the other, be $2n\pi$, where n is an integer.

18 Claims, 5 Drawing Sheets

U.S. PATENT DOCUMENTS

| | | |
|---|---|---|
| 6,252,403 B1 | 6/2001 | Alsop |
| 6,369,570 B1 * | 4/2002 | Wong et al. ............... 324/318 |
| 6,377,836 B1 * | 4/2002 | Arakawa et al. ........... 600/422 |
| 6,420,871 B1 | 7/2002 | Wong et al. |
| 6,493,572 B1 * | 12/2002 | Su et al. .................... 600/422 |
| 6,590,394 B2 * | 7/2003 | Wong et al. ................ 324/318 |
| 6,806,713 B2 * | 10/2004 | Wong ......................... 324/318 |

FOREIGN PATENT DOCUMENTS

| | | |
|---|---|---|
| EP | 1113287 A2 | 7/2001 |
| EP | 1143257 A2 | 10/2001 |
| GB | 2331808 A | 6/1999 |
| JP | 056261082 | 10/1993 |
| JP | 11239569 | 9/1999 |
| WO | WO 01/94964 A1 | 12/2001 |

OTHER PUBLICATIONS

S. Wong et al.; "RF Transmit-Receive Coil for Prepolarized MRI of the Wrist"; Department of Electrical Engineering CA.*

Todd G. Ruskell et al.; "Field mapping with the magnetic resonance force microscope" 1999; Journal of Applied Physics; vol. 86, #1, pp. 664-670.*

Alderman, D.W. et al., "An Efficient Decoupler Coil Design Which Reduces Heating in Conductive Samples in Superconducting Spectrometers", *Journal of Magnetic Resonance*, 1979, pp. 447-451, vol. 36, Academic Press, Inc., Great Britain.

Hayes, Cecil E. et al., "An Efficient Highly Homogenous Radiofrequency Coil for Whole-Body NMR Imaging at 1.5 T", *Journal of Magnetic Resonance*, 1985, pp. 622-628, vol. 63, Academic Press, Inc.

Alsop, David C. et al., "A Spiral Volume Coil for Improved Radio Frequency Field Homogeneity at High Statis Magnetic Field Strength", *Magn. Reson. Med.*, 1998, pp. 49-54, vol. 40, Williams & Wilkins.

* cited by examiner

METHOD AND APPARATUS FOR MAGNETIC RESONANCE IMAGING INCORPORATING A SPIRAL COIL

CROSS-REFERENCE TO RELATED APPLICATION(S)

The present application claims the benefit of U.S. Provisional Patent Application Ser. No. 60/306,962; filed Jul. 20, 2001, which is hereby incorporated by reference herein in its entirety, including any figures, tables, or drawings.

BACKGROUND OF INVENTION

Figure 1:
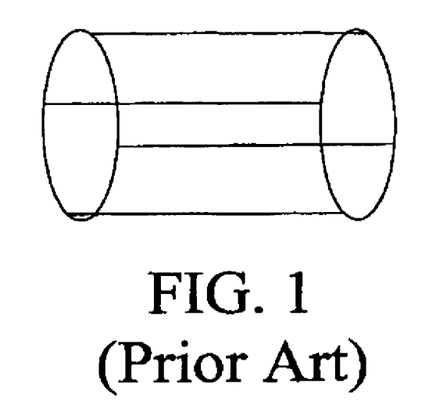
FIG. 1 shows a standard birdcage coil having four conductive connective members.

The present invention relates to magnetic resonance imaging (MRI) systems. Receiving coils are used in MRI systems to intercept the radio frequency magnetic field generated by a human subject or object in the presence of a main magnetic field. Many coil designs exist for use in MRI systems, including what is often referred to as a "birdcage" coil. The birdcage coil has been described in the Journal of Magnetic Resonance (1985) 63:622-628 and U.S. Pat. No. 4,680,548 to Edelstein et al. FIG. 1 shows a standard birdcage coil having four conductive connection members connecting two circular conductive loops. Although four conductive connection members have been shown in FIG. 1, other numbers of conductive members can be used, such as two, six, or eight members. Each coil can be viewed as a separate quadrature coil system.

A spiral volume coil was introduced in April 1998 at the ISMRM meeting in Sydney, Australia by David Alsop and others from the University of Pennsylvania Medical Center. This new spiral volume coil replaced the straight conductive connection members of the standard birdcage with spiral conductive connection members. Others have utilized this spiral volume coil to achieve improved uniformity.

BRIEF SUMMARY OF THE INVENTION

The subject invention pertains to a method and apparatus utilizing one or more spiral coils, such as spiral birdcage coils, spiral Alderman-Grant coils, spiral saddle coils, Helmholtz coil pairs, and other spiral volume and spiral surface coils. The spiral coils of the subject array can be substantially isolated from each other while covering nearly the same volume or surface. For cylindrical geometrics, isolation can be enhanced by having the rotation, or change in direction from one end of the coil to the other, be $2n\pi$, where n is an integer, for quadrature mode isolation and $(2n+1)\pi$ for linear mode isolation.

Figure 2A:
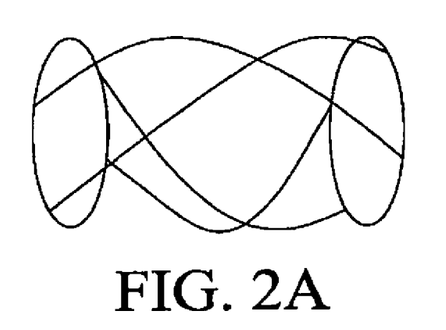
FIG. 2A shows a spiral birdcage coil having four conductive connective members which each experience a rotation of $\pi$ from the first circular conductive loop to the second circular conductive loop.
Figure 2B:
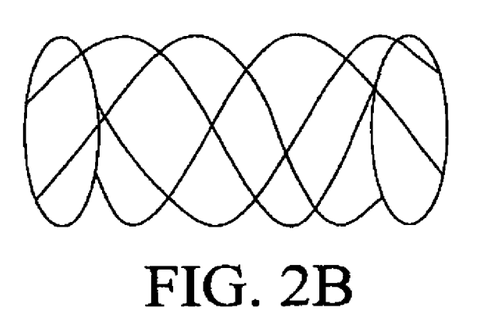
FIG. 2B shows a spiral birdcage coil having four conductive connective members which each experience a rotation of $2\pi$ from the first circular conductive loop to the second circular conductive loop.
Figure 3:
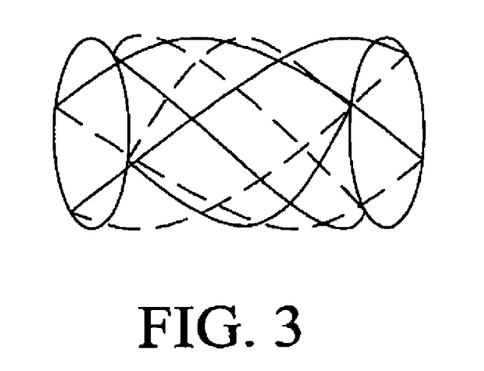
FIG. 3 shows a pair of spiral birdcage coils each having four conductive connective members, where the four conductive connective members of the first coil experience a rotation of $\pi$ from the first circular conductive loop to the second circular conductive loop and the four conductive connective members of the second coil (dashed) experience a rotation of $\pi$, in a opposite direction to the first coils, from the first circular conductive loop to the second conductive loop.

FIG. 2A shows a spiral birdcage with a rotation of $\pi$. FIG. 3 shows a pair of birdcage coils, a first having four conductive connectors with a rotation in a first direction of $\pi$ and another having four conductive connectors (dashed) with a rotation in the opposite direction of $\pi$. Additional embodiments of the subject invention can incorporate birdcage coils having two (Alderman-Grant style coil), three, or more than four conductive connectors. FIG. 2B shows a spiral birdcage with a rotation of $2\pi$. As the net difference in rotation is $2n\pi$, the two birdcage coils formed from the two sets of four conductive connectors, as shown in FIG. 3, can be approximately isolated from each other. In another embodiment, a standard birdcage coil as shown in FIG. 1 can be approximately isolated from a spiral birdcage coil similar to the one shown in FIG. 2 having a $2\pi$ rotation.

In additional embodiments, additional coils can be added and can be isolated as well, with all the coils optionally in quadrature. For eample, a non-rotated, a $2\pi$ rotated, and a $-2\pi$ rotated birdcage coil can all be isolated from each other. This can result in an increased signal-to-noise ratio (SNR). Also, the subject invention can allow easy partially parallel imaging (e.g., SENSE and SMASH) due to the linear phase difference from one end of the coil channels to the other. The subject coil designs can produce highly desirable results for these partially parallel imaging techniques and can allow shortening of the time needed for imaging and/or allow for faster real-time imagery.

The subject invention also pertains to spirals of less than $2n\pi$ where n is an integer. For example, spirals of 90° can be utilized.

DETAILED DISCLOSURE

The subject invention pertains to a method and apparatus utilizing one or more spiral coils, such as spiral birdcage coils, spiral Alderman-Grant (Alderman, D. W. and Grant, D. M., *Jo. Magnetic Resonance* 36:447 [1979]) type of coil, spiral saddle coils, Helmholtz coil pairs, and other spiral volume and spiral surface coils. The spiral coils of the subject array can be substantially isolated from each other while covering nearly the same volume or surface. Examples of surface coils include, but are not limited to, one coil of a Helmholtz pair of coils. For cylindrical geometrics, isolation can be enhanced by having the rotation, or change in direction from one end of the coil to the other, be $2n\pi$, where n is an integer.

In additional embodiments, additional coils can be added and can be isolated as well, with all the coils optionally in quadrature. This can result in an increased signal-to-noise ratio (SNR). Also, the subject invention can allow partially parallel imaging (e.g., SENSE and SMASH) due to the linear phase difference from one end of the coil channels to the other. The subject coil designs can produce highly desirable results for these partially parallel imaging techniques and can allow shortening of the time needed for imaging and/or allow for faster real-time imagery.

The subject invention also pertains to spirals of less than $2n\pi$ where n is an integer. For example, spirals of 180° and of 90° can be utilized.

FIG. 1 shows a standard birdcage coil having two circular conductive loops and four conductive connection members connecting the two circular loops.

FIG. 2A shows a spiral birdcage with a rotation of $\pi$. FIG. 3 shows a pair of birdcage coils, a first having four conductive connectors with a rotation in a first direction of $\pi$ and another having four conductive connectors (dashed) with a rotation in the opposite direction of $\pi$. Additional embodiments of the subject invention can incorporate birdcage coils having two (Alderman-Grant style coil), three, or more than four conductive connectors. FIG. 2B shows a spiral birdcage with a rotation of $2\pi$. As the net difference in rotation is $2n\pi$, the two birdcage coils formed from the two sets of four conductive connectors, as shown in FIG. 3, can be approximately isolated from each other. In another embodiment, a standard birdcage coil as shown in FIG. 1 can be approximately isolated from a spiral birdcage coil, similar to the one shown in FIG. 2B, having a $2n\pi$ rotation.

Figure 7A:
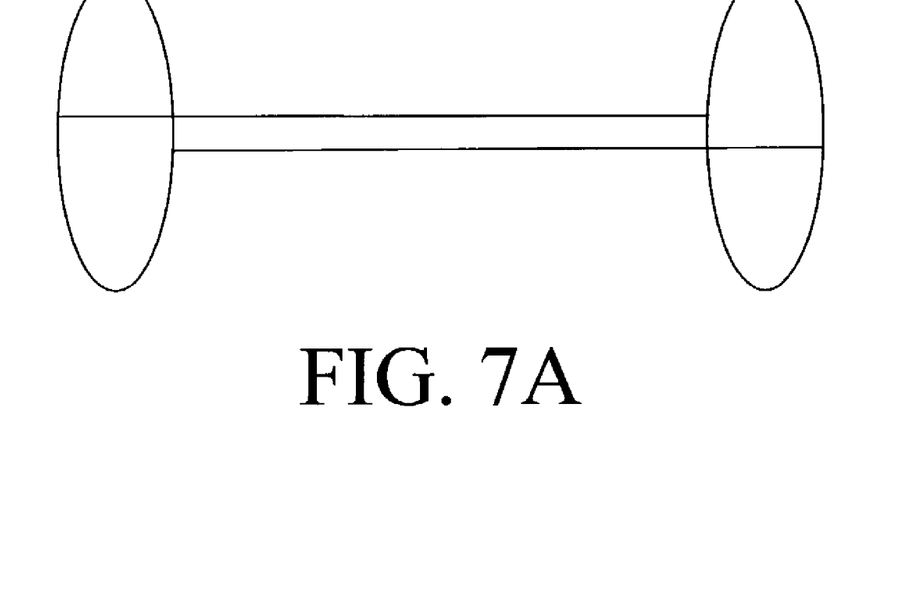
FIG. 7A shows an Alderman-Grant style coil which can be utilized in accordance with the subject invention.
Figure 7B:
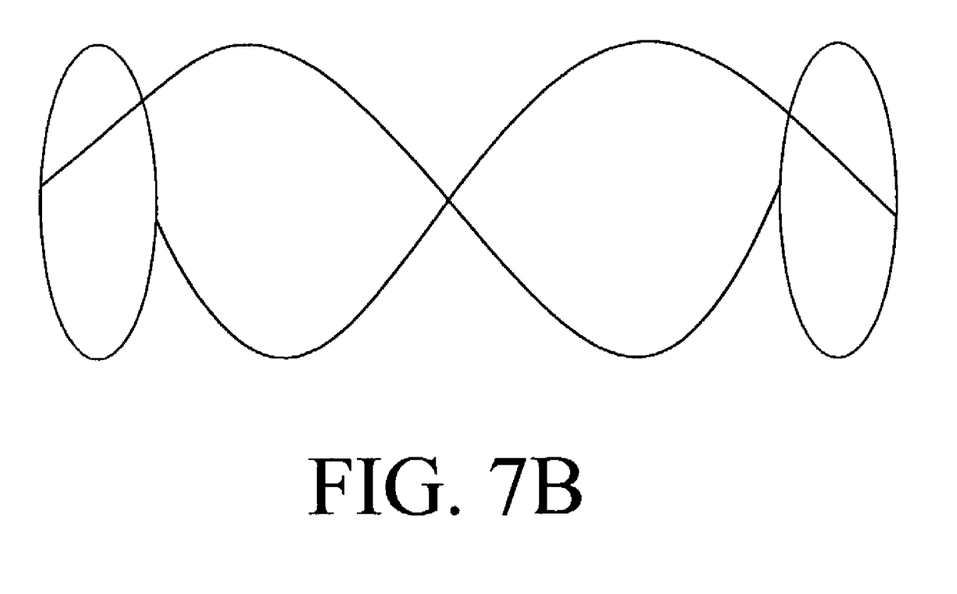
FIG. 7B shows the Alderman-Grant style coil of FIG. 7A after rotation of the coil by $\pi$ about the axis of the cylindrical volume with the end loop of the Alderman-Grant style coil.

An Alderman-Grant type of coil is shown in FIG. 7A and a twisted Alderman-Grant type of coil is shown in FIG. 7B, Such an Alderman-Grant coil incorporates two coils and two conductive connection members such that the two conductive connection members carry the same magnitude current in opposite directions. The currents flowing in each of the conductive connection members are split when the currents enter the coils, with one-half the magnitude of the current flowing in each half of the coil to the other conductive connection member. In a linear mode, as the coil in FIG. 7B is rotated $\pi$ or $(2n+1)\pi$, the coil shown in FIG. 7B is approximately isolated from the coil shown in FIG. 7A. The coil shown in FIG. 7B can be further rotated to a total of $2\pi$ (or $2n\pi$) such that the coil of FIG. 7A and the coil of FIG. 7B are approximately isolated from each other, even in a quadrature mode. Also, the coil shown in FIG. 7A can be rotated $\pi$ in the opposite direction such that the two coils are approximately isolated from each other.

Figure 4:
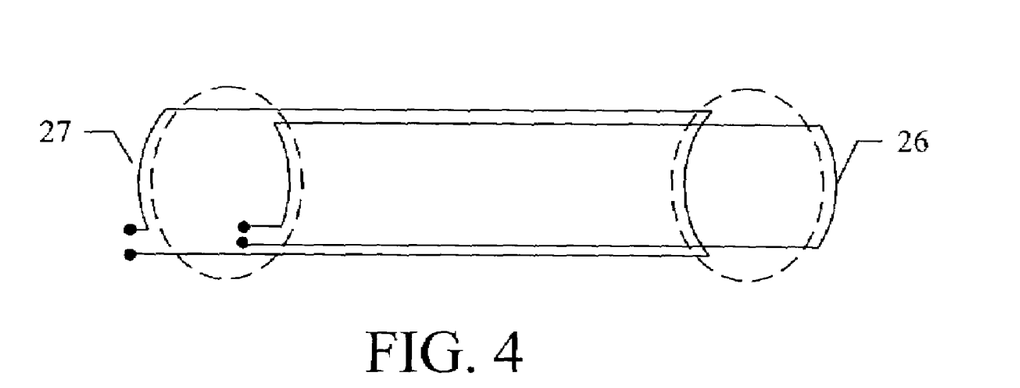
FIG. 4 shows a Helmholtz pair of large loops which can be utilized with the subject invention and which can be rotated and utilized in accordance with the subject invention.
Figure 5:
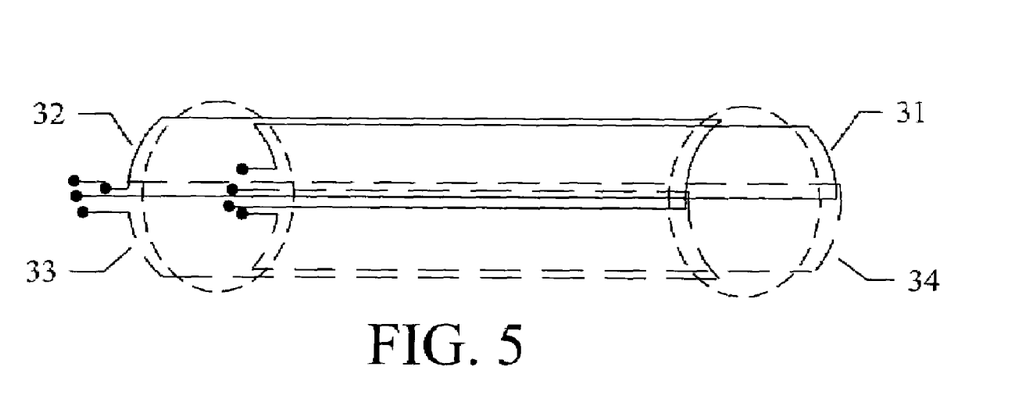
FIG. 5 shows a Helmholtz pair top loops and a Helmholtz pair bottom loops which can be utilized with the subject invention and which one or both pairs can be rotated and utilized in accordance with the subject invention.
Figure 6:
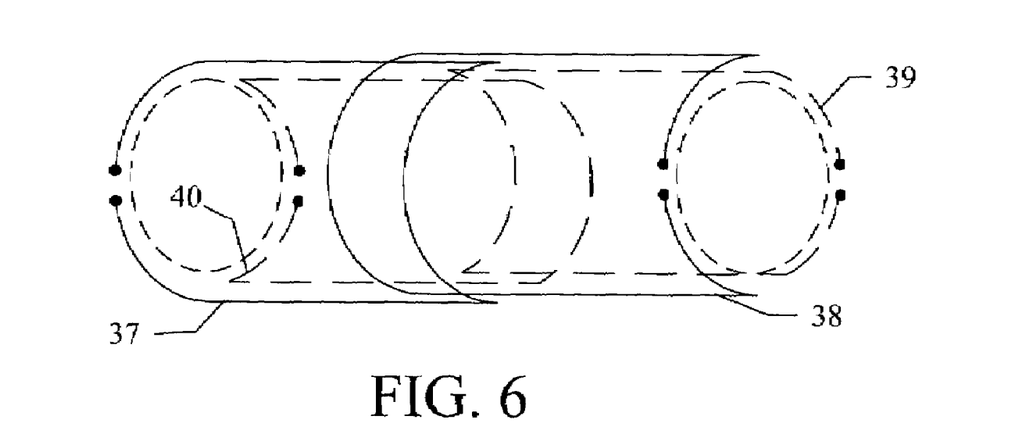
FIG. 6 shows two Helmholtz pairs side-by-side loops which can be utilized with the subject invention and which one or both pairs can be rotated and utilized in accordance with the subject invention.
Figure 8A:
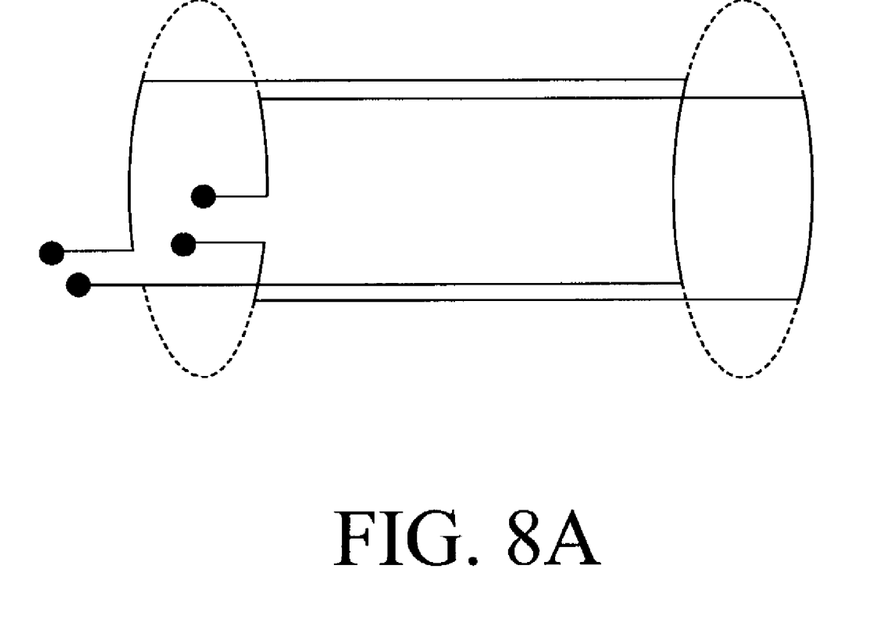
FIG. 8A shows a Helmholtz pair of large loops which can be utilized with the subject invention.
Figure 8B:
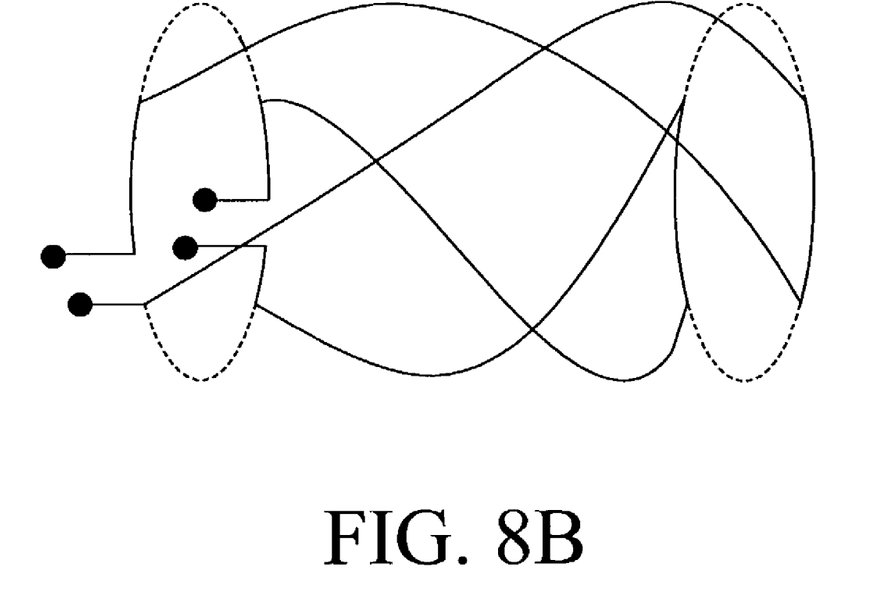
FIG. 8B shows the Helmholtz pair of FIG. 8A after rotation of the Helmholtz pair of large loops by $\pi$ about the axis of the cylindrical volume within the dashed circles on which the end portions of the Helmholtz pair of large loops lie.
Figure 9:
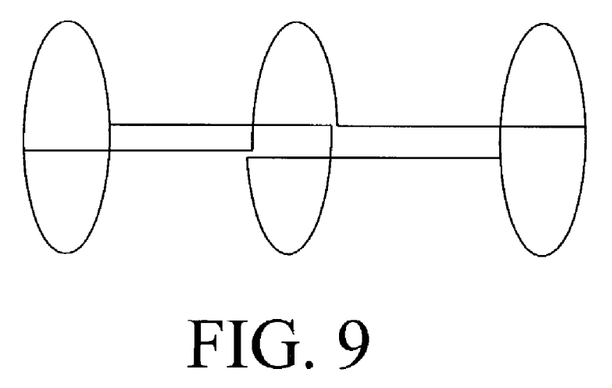
FIG. 9 shows an Alderman-Grant style coil of FIG. 7A after rotation of the conductive connections connecting the two end coils have each undergone a $\pi$ rotation about the axis of the cylindrical volume within the end coils of the Alderman-Grant style coil.
Figure 10A:
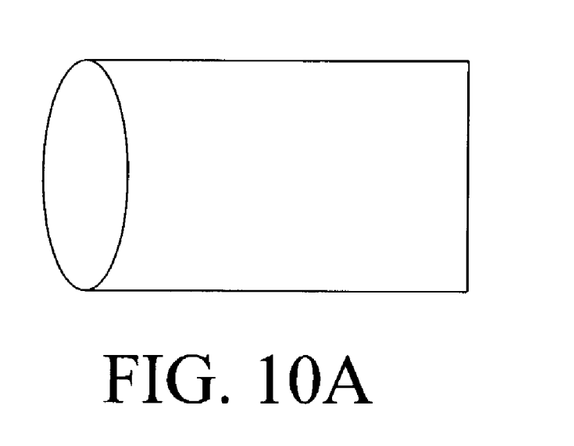
FIG. 10A shows a specific coil configuration which can be incorporated by an embodiment of the subject invention.
Figure 10B:
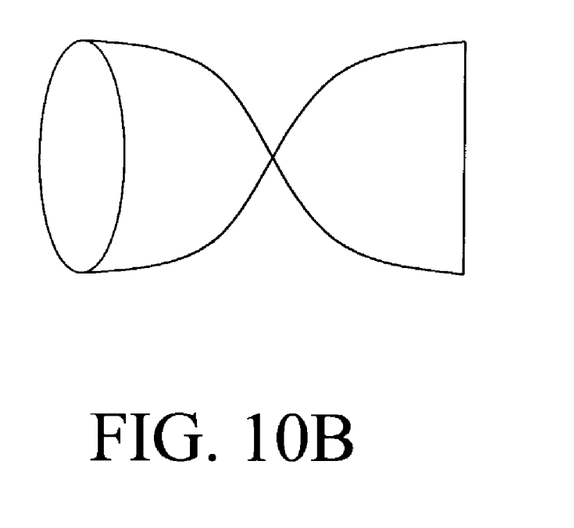
FIG. 10B shows the coil configuration of FIG. 10A after π rotation of the coil about an axis passing through the center of the end coil and perpendicular to the end coil.

FIGS. 4, 5, and 6 illustrate a few examples of Helmholtz pairs which can be rotated in accordance with the subject invention. These Helmholtz coils can be incorporated with other embodiments of the subject invention as well, for example embodiments having additional coils, additional channels, different coil orientations, and/or different size coils. Even though the loops in FIGS. 4, 5, and 6 are shown as single turns, or loops, the loops that make up a Helmholtz pair can also be multiturn solenoids and can be wound as series loops or parallel loops. Also, the connections between 26 and 27, 31 and 32, 33 and 34, 37 and 40, and 38 and 39 can be series or parallel and allow approximately equal currents to flow in the two loops of the pair. In accordance with the subject invention, the Helmholtz coils shown in FIGS. 4, 5, and 6 can be rotated around the volume of interest. The volume of interest can be, for example, the cylinder within the dashed end circles. FIGS. 8A and 8B show a Helmholtz coil as shown in FIG. 4, before and after a rotation of $\pi$, respectively. One or both of the coil configurations of FIGS. 8A and 8B can be incorporated with the subject invention. In a linear mode, the coil shown in FIG. 8B is approximately isolated from the coil shown in FIG. 8A. The coil in FIG. 8B can be further rotated to a total of $2\pi$ (or $2n\pi$) so as to be approximately isolated from the coil of FIG. 8A, even in a quadrature mode. Also, the coil of FIG. 8A can be rotated $\pi$ (or $(2n+1)\pi$) in the opposite direction as the rotation of the FIG. 8B coil so as to be approximately isolated from the coil in FIG. 8B, even in the quadrature mode.

FIG. 4 shows an embodiment incorporating a "large loops" Helmholtz coil pair. Although the preferred embodiment of the large loops Helmholtz pair is shown, where the large static magnetic field used during NMR is oriented from bottom to top of the Figure, the end portions of loops 26 and 27 can be rotated about the central axis of the cylinder indicated by the dashed circles in FIG. 4. An additional large loop Helmholtz coil pair can be utilized if desired. For example, an additional large loop Helmholtz coil pair can be added such that the end portions of the additional Helmholtz coil pair coils are positioned to the top and bottom of the embodiment shown in FIG. 4 such that essentially the entire cylinder formed by loops 23, 24, and 25 is surrounded by the two large loop Helmholtz coil pairs. Again, one or both of the additional Helmholtz coil pairs can be rotated in accordance with the subject invention.

FIG. 5 shows an embodiment which incorporates top/bottom loops. In this embodiment coil 31 and coil 32 form a top coil pair and coil 33 and coil 34 form a bottom coil pair. Preferably, the coil pairs overlap such that mutual inductance between coil 32 and coil 33 and between coil 31 and coil 34 is low. Most preferably, the amount of overlap can be selected so as to achieve approximately zero mutual inductance. Additional coil pairs can be added and/or the coil pair(s) can be rotated with respect to the central axis of the cylinder. Again, one or more of these coil pairs can be rotated in accordance with the subject invention.

FIG. 6 shows an embodiment of the subject invention incorporating side by side loops. Loops 37 and 40 form one loop pair and loops 38 and 39 form another. Preferably the amount of overlap of side by side loop pairs is chosen so that the mutual inductance of the loops is low, and, more preferably, the amount of overlap is chosen so that the mutual inductance is approximately zero. Additional loops can be added to one or more side by side pairs and/or additional side by side pairs can be added. Again, the side by side pairs can be rotated with respect to the central axis of the cylinder formed by loops 23, 24 and 25, and one or more of these coil pairs can be rotated in accordance with the subject invention.

As discussed with the coil configurations shown in FIGS. 1, 4, 7A, 8A, and 10A, the coil configurations shown in FIGS. 5 and 6 can also be rotated $(2n+1)\pi$ or $2n\pi$, or some other proportion of $(2n+1)\pi$ or $2n\pi$ which compliments a rotation of another coil configuration to create a $(2n+1)\pi$ or $2n\pi$ net rotation difference, so as to be approximately isolated from, for example, the coil configurations shown in FIGS. 5 and 6. Again a net rotation difference of $(2n+1)\pi$ can allow isolation for linear modes and a net rotation difference of $2n\pi$ can allow for isolation for linear and quadrature modes.

Utilizing one coil of Helmholtz or saddle coil pairs 26 and 27, 31 and 34, 37 and 40, and 38 and 39 can create a surface coil. A $(2n+1)\pi$ rotated version of the individual coil can be approximately isolated from the original individual coil in a linear mode and a $2n\pi$ rotated version can be approximately isolated in a linear or quadrature mode. Additional $(2m+1)\pi$ or $2m\pi$ rotated versions, where m is an integer and $m\neq n$, can be approximately isolated from the original unrotated version and the $(2n+1)\pi$ or $2n\pi$ rotated version as well. Again, a $-(2n+1)\pi$ or $-2n\pi$ rotated version can be approximately isolated as well. Also, any combination of rotated or non-rotated coils where the net difference in rotation is $(2n+1)\pi$ or $2n\pi$ can be approximately isolated for linear or quadrature modes, respectively.

The pitch of rotation of the coils in accordance with the subject invention can be uniform or non-uniform. For conventional horizontal field coils, the higher the amount of pitch (rotation per length) the lower the SNR of the channel tends to be. Adding another channel should increase the SNR but the increase will tend to diminish as more channels are added. For vertical field systems, the higher the amount of pitch, the higher the SNR will tend to be.

Birdcage type coil designs that have end-rings, or circular conductive loops, for return currents can have isolation issues because the two modes of a given coil can have different coupling to another mode of another (different rotation) coil. This is because coupling between end-ring currents differs from coupling between the legs or conductive connective members. Helmholtz pairs, saddle coils, and other surface coils can be constructed with helical configurations in accordance with the subject invention.

If only the legs of spiral volume coils are considered, then both modes can be isolated from both modes of another coil whose rotation differs by an integer multiple of $2\pi$. In principle, any number of channels can be employed. For example, coils having $+\pi$ and $-\pi$ rotations, respectively, can have legs which are isolated from one another. The leg currents of a conventional birdcage (zero rotation) are isolated from a $+2n\pi$ and $-2n\pi$ rotation versions, where n is an integer. However, the end-rings can couple to one another. In order to minimize the coupling of end-rings of different coils, common end-rings with shared capacitance in legs can be utilized. Common end-rings can be particularly suitable for birdcage coils having $+2n\pi$, $-2n\pi$, and zero, respectively, rotations. Also, coils having channels which have TEM-like coils do not have conventional end-ring currents and can therefore enhance the isolation from modes of coils having end-ring currents. These, and other approaches, can be used to effectively isolate most, if not all, modes from one another.

Linear channels can be effectively isolated from each other by having leg rotations which differ by $n\pi$ rotations. This can allow more channels with different forms, which can be used with, for example, SMASH/SENSE. The use of linear channels with leg rotations differing by $n\pi$ can have lower SNR since the quad channel is unavailable.

For horizontal field systems the quad channel can be combined with a 90° phase change with very little change in SNR or SENSE capability.

For vertical field systems, the "quad" channel would not be combined since the signal would be in phase. For best performance each channel can go to a separate receiver.

In a specific embodiment, which can have a high SNR per channel, an array of birdcage coils having leg rotations of $+2n\pi$, $-2n\pi$ and zero, respectively, can all share the same end-rings. Shared capacitors can be utilized to isolate the coils by canceling the mutual inductance associated with end-ring return currents. This embodiment can provide 3 channels by quadrature combining each quad pair. In addition, the SNR of this embodiment can be higher, and potentially as much as approximately 40-50% higher, than the SNR of a birdcage coil having the same length and diameter. This embodiment can also speed up the imaging with speed up factors of nearly 3 possible. If another channel is used, for example, by not combining one pair or perhaps adding a counter rotating coil (CRC), may further speed up the imaging. Also, the dimension along central cylinder axis can be used for partially parallel imaging techniques.

The method and apparatus of the subject invention can have little or no noise correlation, making them ideal for use in conventional reconstruction and for use with partially parallel imaging methods. In addition, the uniformity of the subject spiral coils can be improved compared to standard coils and fall-off at the coil ends sharper compared to standard coils. Such improved uniformity and fall-off can make the subject coil designs useful as transmit coils. Also, the subject coil designs can be advantageous for imaging cylindrical regions with lengths greater than their diameter. The subject coil designs can also be utilized for imaging ellipsoidal volume regions.

Partial volume coils, e.g. half-cylinders, can also incorporate the rotation of the subject invention. Flat coils can be used at particular conductor angles.

A TEM version of a spiral birdcage with a $2n\pi$ rotation of legs and a direct connection of return paths (near the same diameter) can have addition of field in the center of the coil and cancellation of field near the ends of the coil. Accordingly, a higher SNR in the center can result, with a narrower field of view. In fact, such a coil design can be advantageous for imaging the particular point in the center of the coil because the net effective current amplitude is a raised cosine field.

Helical birdcage coil sets can result in a set of magnetic fields in a cosine, sine basis set which can be orthogonal over the volume of the coil. These orthogonal fields can result in isolation between modes (related to orthogonality of the function) and low correlation of noise between modes. In principle, any orthogonal set can be employed to perform the same basic functions.

The subject invention also relates to other coil structures which produce fields having forms that are nearly orthogonal over the volume of sample between them. Specific embodiments incorporate coil structures having field patterns that are similar to the sine-cosine basis. It is difficult, if possible, to make these patterns exactly, due to the fact that real fields will decline to zero as one moves away from the current carrying elements. The subject invention can utilize coil structures where each element can produce a magnetic field that is substantially isolated from every other element's magnetic field and each element can produce an electric field that is substantially isolated from every other element's electric field. Additional means of isolation can also be employed. All traditional surface coils and volume coils that can be constructed on a cylinder have analogous spiral versions with multiple pitch angles allowing for multiple versions of the same basic structure. The subject coil designs can also be utilized for imaging irregularly shaped surfaces or volumes of interest.

In specific embodiments, the difference in rotation between elements is $2n\pi$, such that the elements can be isolated from one another. With respect to these embodiments, one or more additional elements can be used, rotated with respect to each of the others so as to be isolated as well. With respect to linear situations, one element can be rotated $\pi$ about the volume of interest, for example a cylinder, or two elements can be rotated so that a net difference of $\pi$ exist between them. In additional embodiments, more or less rotation of an element or elements can be employed, while using, for example, other means of isolation such as shared capacitance, or mutual inductors, and/or non-uniform pitch angles can be employed as well. In a specific embodiment, the amount of the more or less rotation of an element is less than about 10% of the nominal rotation. In another specific embodiment, the amount of the more or less rotation of an element is less than about 5%.

The spiral coil geometries of the subject invention can be used in situations where a cylinder is employed and the axis of the cylinder is perpendicular to the main magnetic field and can also be used in situations where the cylinder is parallel to the main magnetic field.

Another useful outcome of utilizing an approximately sine-cosine magnetic field basis set is that the net magnetic field resulting from a particular phased-weighted addition of the elements can produce a relatively arbitrary profile. The specific benefit of this approach is that for fields of view with a short coverage in the cylinder axis direction, the field can be collapsed to much shorter than the length of the whole coil. For transmit situations, such as for body coils, this would allow much lower power deposition in the body.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. A coil configuration for a magnetic resonance imaging system, comprising:
   a first coil for magnetic resonance imaging covering at least a portion of a surface or volume of interest; and a second coil for magnetic resonance imaging spiraling around and covering said at least portion of the surface or volume, wherein the coil configuration is single-tuned such that the first coil and the second coil are tuned to the same frequency,
   wherein the first coil and the second coil are substantially inductively isolated from each other.

2. The coil configuration according to claim 1, wherein the surface or volume of interest is a cylindrical volume.

3. The coil configuration according to claim 2 wherein the second coil comprises:
   two circular conductive loops located at opposite ends of the cylindrical volume; and at least one conductive connection member connecting the two circular loops.

4. The coil configuration according to claim 3, wherein the second coil comprises two conductive connection members connecting the two circular loops.

5. The coil configuration according to claim 1, wherein the volume of interest is ellipsoidal.

6. The coil configuration according to claim 1,
   wherein the surface or volume of interest is a tapered cylinder.

7. The coil configuration according to claim 1, wherein the surface or volume of interest is irregularly shaped.

8. The coil configuration according to claim 1,
   wherein the second coil spirals in a first direction and the first coil spirals is an opposite direction,
   wherein the summation of the spiraling of the second coil and the spiraling of the first coil is $2n\pi$,
   where n is an integer.

9. The coil configuration according to claim 8,
   wherein at least one of the first coil and the second coil is in a quadrature mode.

10. The coil configuration according to claim 1,
    wherein the second coil spirals in a first direction and the first coil spirals in the first direction,
    wherein the difference in the spiraling of the second coil and the spiraling of the first coil is $2n\pi$,
    where n is an integer.

11. The coil configuration according to claim 10,
    wherein at least one of the first coil and the second coil is in a quadrature mode.

12. The coil configuration according to claim 1, further comprising:
    at least one additional coil covering said at least a portion of the surface or volume of interest, wherein said at least one additional coil is tuned to the same frequency as the first coil and the second coil,
    wherein the first coil, the second coil, and said at least one additional coil are substantially inductively isolated from each other.

13. The coil configuration according to claim 1,
    wherein at least one of the first coil and the second coil is in a quadrature mode.

14. A coil configuration for a magnetic resonance imaging system, comprising:
    a first coil for magnetic resonance imaging covering at least a portion of a surface of interest; and
    a second coil for magnetic resonance imaging spiraling around and covering said at least portion of the surface,
    wherein the coil configuration is single tuned such that the first coil and the second coil are tuned to the same frequency,
    wherein the first coil and the second coil are substantially inductively isolated from each other.

15. A coil configuration for a magnetic resonance imaging system, comprising:
    a first coil for magnetic resonance imaging covering at least a portion of a volume of interest; and
    a second coil for magnetic resonance imaging spiraling around and covering said at least portion of the volume, wherein the coil configuration is single tuned such that the first coil and the second coil are tuned to the same frequency,
wherein the first coil and the second coil are substantially inductively isolated from each other.

16. The coil configuration according to claim 15,
wherein the second coil is a spiraled version of the first coil.

17. The coil configuration according to claim 16,
wherein the second coil is selected from the group consisting of: spiral birdcage coil, spiral Alderman-Grant coil, spiral saddle coil, and spiral Helmholtz coil.

18. The coil configuration according to claim 17,
wherein the second coil is a spiral birdcage coil.

* * * * *